US009542995B2

(12) United States Patent
Sachdev et al.

(10) Patent No.: US 9,542,995 B2
(45) Date of Patent: Jan. 10, 2017

(54) THRESHOLD VOLTAGE MISMATCH COMPENSATION SENSE-AMPLIFIERS FOR STATIC RANDOM ACCESS MEMORIES WITH MULTIPLE DIFFERENTIAL INPUTS

(71) Applicants: Manoj Sachdev, Waterloo (CA); Jaspal Singh Shah, Ottawa (CA)

(72) Inventors: Manoj Sachdev, Waterloo (CA); Jaspal Singh Shah, Ottawa (CA)

(73) Assignee: Manoj Sachdev, Waterloo (CA)

( * ) Notice: Subject to any disclaimer, the term of this patent is extended or adjusted under 35 U.S.C. 154(b) by 0 days.

(21) Appl. No.: 14/470,866

(22) Filed: Aug. 27, 2014

(65) Prior Publication Data
US 2016/0203856 A1     Jul. 14, 2016

Related U.S. Application Data

(60) Provisional application No. 61/959,701, filed on Aug. 30, 2013.

(51) Int. Cl.
*G11C 11/419*     (2006.01)
(52) U.S. Cl.
CPC .................. *G11C 11/419* (2013.01)

(58) Field of Classification Search
CPC ................. G11C 11/419; G11C 7/065
USPC ................................... 365/154, 205
See application file for complete search history.

(56) References Cited

U.S. PATENT DOCUMENTS

| 5,553,029 | A | * | 9/1996 | Reohr | G11C 8/10 365/203 |
|---|---|---|---|---|---|
| 5,783,949 | A | * | 7/1998 | Reohr | G11C 8/10 326/105 |
| 5,815,432 | A | * | 9/1998 | Naffziger | G11C 11/412 365/154 |
| 8,488,403 | B2 | * | 7/2013 | Sachdev | G11C 7/062 365/207 |
| 2013/0044555 | A1 | * | 2/2013 | Sutardja | G06F 9/3804 365/203 |
| 2015/0146475 | A1 | * | 5/2015 | Giridhar | G11C 7/065 365/154 |

* cited by examiner

*Primary Examiner* — Michael Tran

(57) ABSTRACT

Sense amplifier configurations for memories are described. In these configurations, the differential inputs are boosted proportional to the respective bitline voltage enabling a low-voltage, reliable, faster sense amplifier operation. Disclosed sense amplifiers are also capable of compensating the threshold mismatch between the sensing transistors.

14 Claims, 11 Drawing Sheets

(a)

(b)

THRESHOLD VOLTAGE MISMATCH COMPENSATION SENSE-AMPLIFIERS FOR STATIC RANDOM ACCESS MEMORIES WITH MULTIPLE DIFFERENTIAL INPUTS

This application claims the benefit of priority of U.S. Provisional Patent Application No. 61/959,701 filed Aug. 30, 2013 which is incorporated herein by reference in its entirety.

TECHNICAL FIELD OF INVENTION

This invention relates to the circuit technology associated with sense amplifiers in semiconductor memories. The proposed sense amplifier topology offers reliable, faster sensing capabilities. Some of the embodiments also have desired low-voltage operation.

BACKGROUND OF THE INVENTION

On chip Static Random Access Memories (SRAMs) are critical component of the modern system-on-a-chip (SOC) solutions. As CMOS technology has scaled into deep nanometric regime, the density of static random access memory (SRAM) has increased manifolds. As a consequence, for the same die area, density of SRAM bit-cells has increased and there is a great motivation to improve reliability, yield and performance of dense SRAM arrays.

A typical SRAM array is organized in multiple rows (N) and columns (M) as shown in FIG. 1. Each bit-cell stores one bit of data; a logic value of one or zero. Each bit-cell in a typical row and column is controlled through a word-line (WL) and a pair of differential bit-lines (BLT and BLC) shown as $B_i$ in FIG. 1. Based upon the state of the SRAM array the plurality of the bit-cells are in read, write or retention mode. Generally, data in SRAMs is organized in words, and at any given time, only one word-line is selected. A row decoder decodes the row address and the driver activates a row through WL signal. Concurrently, a column decoder takes the column address information to decode the column address and activate the column. The number of columns activated depends upon the word size. In a write operation, column decoder and bitline drivers would set the bit-lines to appropriate values (logic one or zero) based upon the input data ($D_i$). During a read operation, sense amplifiers takes differential input from the selected bit-cell to produce a full logic swing output ($Q_i$) and to determine the value of the stored data bit. Column multiplexer is used to selectively connect a number of columns to a sense amplifier. It is achieved by multiplexing the bit-lines in the columns to a single sense amplifier.

In SRAMs, voltage sense amplifier and/or current sense amplifiers are typically used to sense data in the selected cell and amplify it to full swing. Usage of sense amplifier results in substantial area, power and energy savings. Current mode sense amplifiers are preferred when faster speed of operation is required. A current mode sense amplifier senses and amplifies the current from the selected cell. Alternatively, a voltage mode sense amplifier senses the differential voltage across the selected bitlines and amplifies it. A voltage mode sense amplifier is generally preferred for low-power applications.

All amplifiers including sense amplifiers have a finite, intrinsic offset voltage. Inherent manufacturing process variation, transistor mismatch, temperature, etc. contribute to the offset voltage of a sense amplifier. Therefore, for robust decision making, differential input must be larger than the worst case offset voltage of the sense amplifier.

FIG. 2(a) illustrates a circuit diagram of a conventional current mode sense amplifier. FIG. 2(b) shows the waveforms which illustrate its timing operation. In this sense amplifier the bitlines are connected to the gates of two NMOS transistors MN1, MN2. A Sense Amplifier Enable (SAE) signal which is initially kept low keeps MP1 and MP2 on and MN5 off. This causes the output nodes OPT and OPC, to pre-charge to logic high level. The sensing operation begins when YMUX signal transitions from high to low. This connects bitlines BLC, BLT to the sense amplifier through the gating transistors MP5, MP6 to the gate of sensing transistors, MN1, and MN2, respectively. Subsequently, the SAE signal is activated to logic high which switches off MP1 and MP2 and turn on MN5. In this process, the sense amplifier is powered on. At this time, the differential voltage at bitlines connected to the gates of MN1 and MN2 cause an imbalanced current to flow in the cross-coupled inverter-pair comprising of MN3, MP3 and MN4, MP4. This imbalance causes different discharging speeds at OPT and OPC from the precharged voltage. Since OPT, OPC are pre-charged to VDD, thus, both PMOS transistors MP3, MP4 are off until the corresponding gate voltage, i.e., output voltage reaches (VDD–$V_{thP}$). Now, the positive feedback amplifies the output voltage difference and fully turns on one NMOS and one PMOS transistor of each cross-coupled inverter pair. For example, if the MN3 is fully turned on which leads to node OPT discharged to ground, MP4 will turn on. As a result, outputs OPT and OPC achieved complementary logic values.

FIG. 3, illustrates a latch-type sense amplifier which is similar to an SRAM cell with two back-to-back inverters forming a latch. Two access transistors, MP5 and MP6 couple the latch nodes, OPT and OPC, to the BLT and BLC, respectively. Sense Amplifier Enable (SAE) signal which is initially kept low keeps MP1 and MP2 on and MN3 off. This causes the output nodes OPT and OPC, to pre-charge to logic high level. The sensing operation begins when YMUX signal transitions from high to low. This connects bitlines BLC, BLT to the sense amplifier through the gating transistors MP6, MP5 to the gate of sensing transistors, MN1, and MN2, respectively. Subsequently, the SAE signal is activated to logic high which switches off MP1 and MP2 and turn on MN3. In this process, the sense amplifier is powered on. At this time, the differential voltage at bitlines connected to OPC and OPT creates an imbalance between overdrive voltage ($V_{GS}$–$V_T$) of latching transistors that leads to regenerative feedback and signal amplification.

One of the problems with the sense amplifier illustrated in FIG. 3 is the threshold voltage mismatch between sensing transistors MN1 and MN2. The differential input signal must be greater than the threshold voltage mismatch, and the associated offset voltage, for the sense amplifier to make a reliable decision. FIG. 4, depicts a threshold mismatch mitigation sense amplifier for memories. The operation of this circuit is described in greater detail by Gupta et. al. in U.S. Pat. No. 7,227,798 B2. Compared to the sense amplifier illustrated in FIG. 3, access transistors, MP4 and MP3 connect bitlines, BLT and BLC, to the latching nodes (OPT, and OPC) of the sense amplifier. Transistor pairs MN1 and MN3; and MN2 and MN4, are in series with their respective gates connected to the bit-lines, BLT and BLC. Putting it alternatively, this arrangement is similar to the cascode amplifier with some important differences, and advantages. Firstly, both transistors in the proposed cascode (e.g., MN1 and MN3; or MN2 and MN4) are sensing transistors with bit-line or its complement signal at their respective gates. As a result, two pairs of sensing transistors work in tandem to amplify the signal.

Secondly, such an arrangement has a capability of compensating threshold voltage mismatch of sensing pair transistors MN3 and MN4 and storing the mismatch on their respective source nodes (nodeA and nodeB) which can be explained with the timing of the sense amplifier illustrated in FIG. 4(b). The read operation starts with bit-lines, BLT and BLC, pre-charged to VDD. Subsequently, a decoded Word-line, WL, makes a positive transition connecting an SRAM bit-cell to BLT and BLC. Assuming without the loss of generality, the BLT is discharged to (VDD−ΔV) owing to the charge sharing with the data stored in the bit-cell, while BLC remains at VDD. During this period the SAED is low, therefore node OPT is discharged to (VDD−ΔV) while OPC remains at VDD. Since transistors MN3 and MN4 are cross coupled, nodeA and nodeB are charged to voltages (VDD−$V_{TMN3}$), and (VDD−$V_{TMN4}$) before MN3 and MN4 are turned-off, respectively. $V_{TMN3}$ and $V_{TMN4}$ are the threshold voltages of MN3 and MN4, and consequently, the potential difference between nodeA and nodeB now stores the threshold voltage mismatch between sensing transistors MN3 and MN4 before sense amplifier starts sensing operation.

The concept of threshold voltage mismatch compensation can be further explained as follows: Assuming that the $V_{TMN3}=V_{TMN4}=V_{TN}$, after the precharge stage, the voltage at nodeA=the voltage at nodeB=(VDD−$V_{TN}$). As illustrated in the timing diagram in FIG. 4(b), the SAE signal makes a positive transition enabling the sense amplifier. In addition, the BLT and BLC nodes are still coupled to OPT, gate of MN1; and to OPC, and the gate of MN2, respectively. Further, assuming that the voltage at BLT=(VDD−Δ), and voltage at BLC=VDD when the SAE makes a positive transition. The initial overdrive voltage conditions for MN3 and MN4 at this moment are: (i) $[V_{GSMN3}-V_{TN}]=[\{(VDD-\Delta V)-(VDD-V_{TN})\}-V_{TN}]=[(V_{TN}-\Delta V)-V_{TN}]=(-\Delta V)$; and (ii) $[V_{GSMN4}-V_{TN}]=[\{(VDD)-(VDD-V_{TN})\}-V_{TN}]=[(V_{TN})-V_{TN}]=0$. As it is apparent to a person knowledgeable in the art; at that instance the transistor MN3 is off by the ΔmV, while the transistor MN4 is precisely at the on/off boundary.

Now considering the realistic scenario where threshold voltage of MN3 and MN4 are $V_{TMN3}$ and $V_{TMN4}$ owing to the process variation. Following the same argument as describe in the preceding paragraph, the initial overdrive voltage conditions for MN3 and MN4 just before, the transistor MN5 is turned on by the SAE positive transition are: (i) $[V_{GSMN3}-V_{TMN3}]=[\{(VDD-\Delta V)-(VDD-V_{TMN3})\}-V_{TMN3}]=[(V_{TMN3}-\Delta)-V_{TMN3}]=(-\Delta V)$; and (ii) $[V_{GSMN4}-V_{TMN4}]=[\{(VDD)-(VDD-V_{TMN4})\}-V_{TMN4}]=[(V_{TMN4})-V_{TMN4}]=0$. Therefore, the initial overdrive voltages of MN3 and MN4 remain the same in spite of their different threshold voltages. In other words, the threshold mismatch between the MN3 and MN4 sensing transistors is compensated. Subsequently, SAED makes a positive transition uncoupling bitlines from the sense amplifier. Now, the sense amplifier is powered and resolves the differential input to full swing level.

One of the disadvantages of the sense amplifier described in U.S. Pat. No. 7,227,798 B2 is its low-voltage operation. There are four transistors that are in series between the power supply voltage, VDD, and the ground. As a result, the circuit is difficult to make it work at lower power supply voltages. In addition, at lower power supply voltage, the differential input signal voltage at bitlines is likely to be relatively small making the task of the sense amplifier even more difficult.

SUMMARY OF THE INVENTION

This invention relates to sense amplifiers for semiconductor memories. The disclosed embodiments in the invention overcome drawback highlighted above and enable reliable, low-voltage, low-power operation of semiconductor memories.

In accordance with one of the embodiments of the invention, a sense amplifier is described that has more than one pair of independent sensing transistors. These sensing transistors are connected to the differential input source such as bitlines. The embodiment has a pair of main sensing transistors, and another pair of auxiliary sensing transistors. The effect of such an arrangement is to have a net addition of differential signals on sensing transistors. Consequently, the proposed sense amplifier can work with smaller differential input while making a reliable decision. This sense amplifier is also capable of mitigating threshold voltage mismatch between the main sensing transistor pair.

Another aspect of the preceding sense amplifier has the differential input signal boosting amplification capability. The input signals are stored on a pair of parallel capacitors each. At an appropriate moment the pair of parallel capacitors is converted into series resulting into amplified and boosted differential input signal. The boosted and amplified differential input is applied to the auxiliary pair of sensing transistors which results in higher overdrive voltage for these transistors. At the same time, larger differential voltage enables a more reliable operation. Hence, the preceding embodiment is able to work at lower-supply voltage, and resolve the input signal faster. Yet another aspect of the preceding embodiment is the delayed activation of the sense amplifier signal so that the impact of amplified differential input signal can be utilized in the decision making by sense amplifier.

In accordance with another embodiment of the invention, a transistors and capacitor arrangement capable of voltage boosting and amplification of input signal is coupled to the bitline, BLT (or BLC) and the sensing node, OPT (or OPC) of the latch-type sense amplifier. Therefore, a relatively smaller differential input signal is adequate for the sense amplifier to make the decision. In this embodiment, the number transistors between VDD and ground are no more than three. Hence, the embodiment is capable of working at lower power supply voltage.

BRIEF DESCRIPTION OF THE DRAWINGS

Different embodiments of the present invention will now be described by way of example only with reference to the following drawings in which.

DETAILED DESCRIPTION OF THE PREFERRED EMBODIMENTS

For convenience, like structures in drawings will be referenced by like numerals in the description. In the present embodiment, the preferred high voltage level or logic 1 is VDD and the preferred low voltage level or logic 0 is ground.

Figure 1:
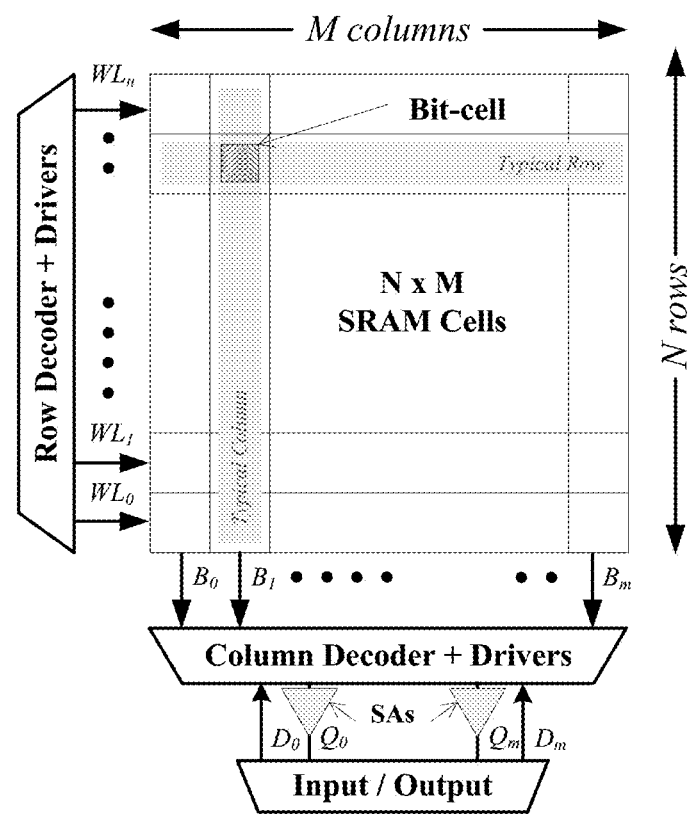
FIG. 1 shows a typical SRAM architecture (prior art)
Figure 2:
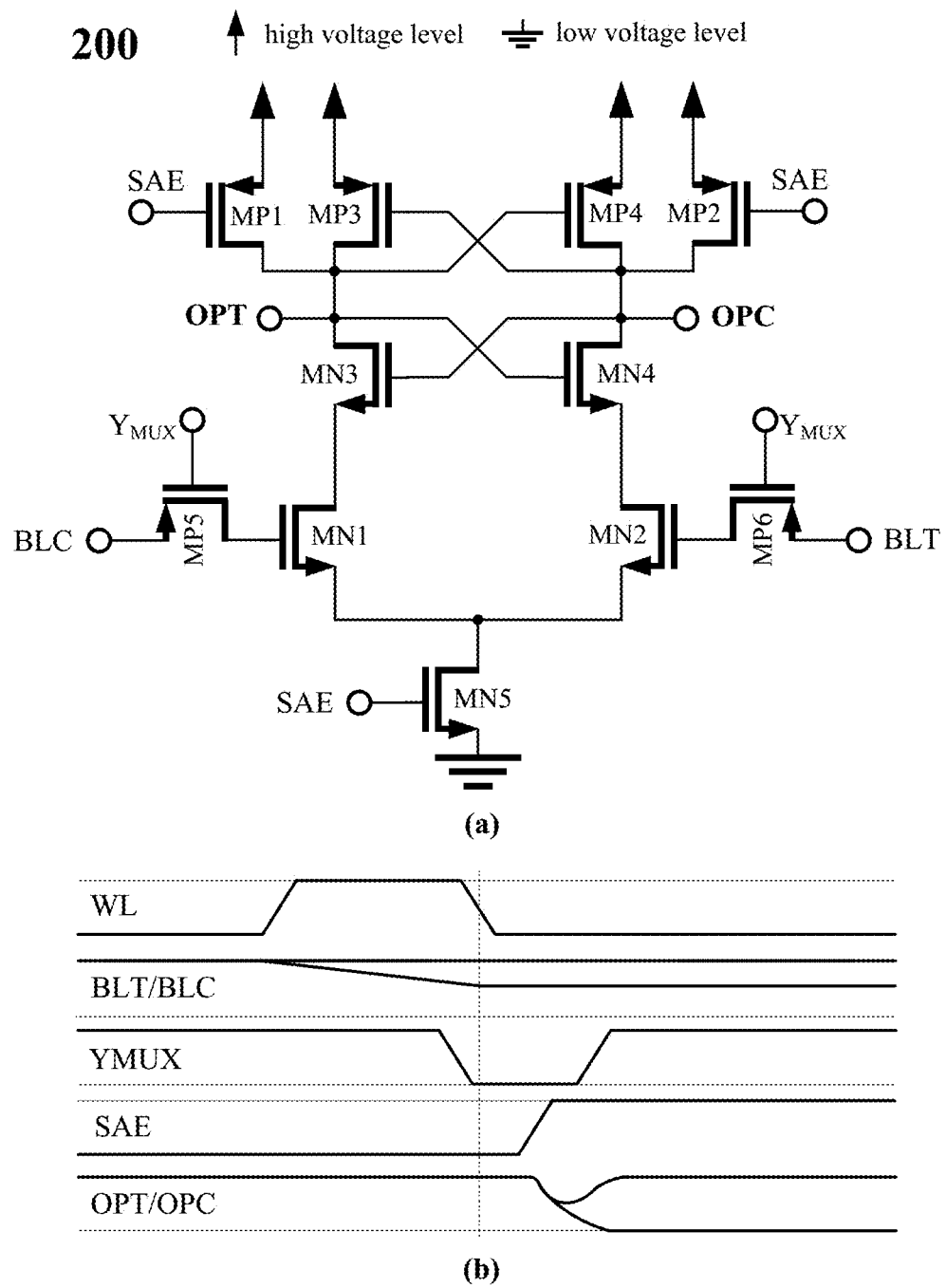
FIG. 2 shows a current mode sense amplifier (prior art)
Figure 3:
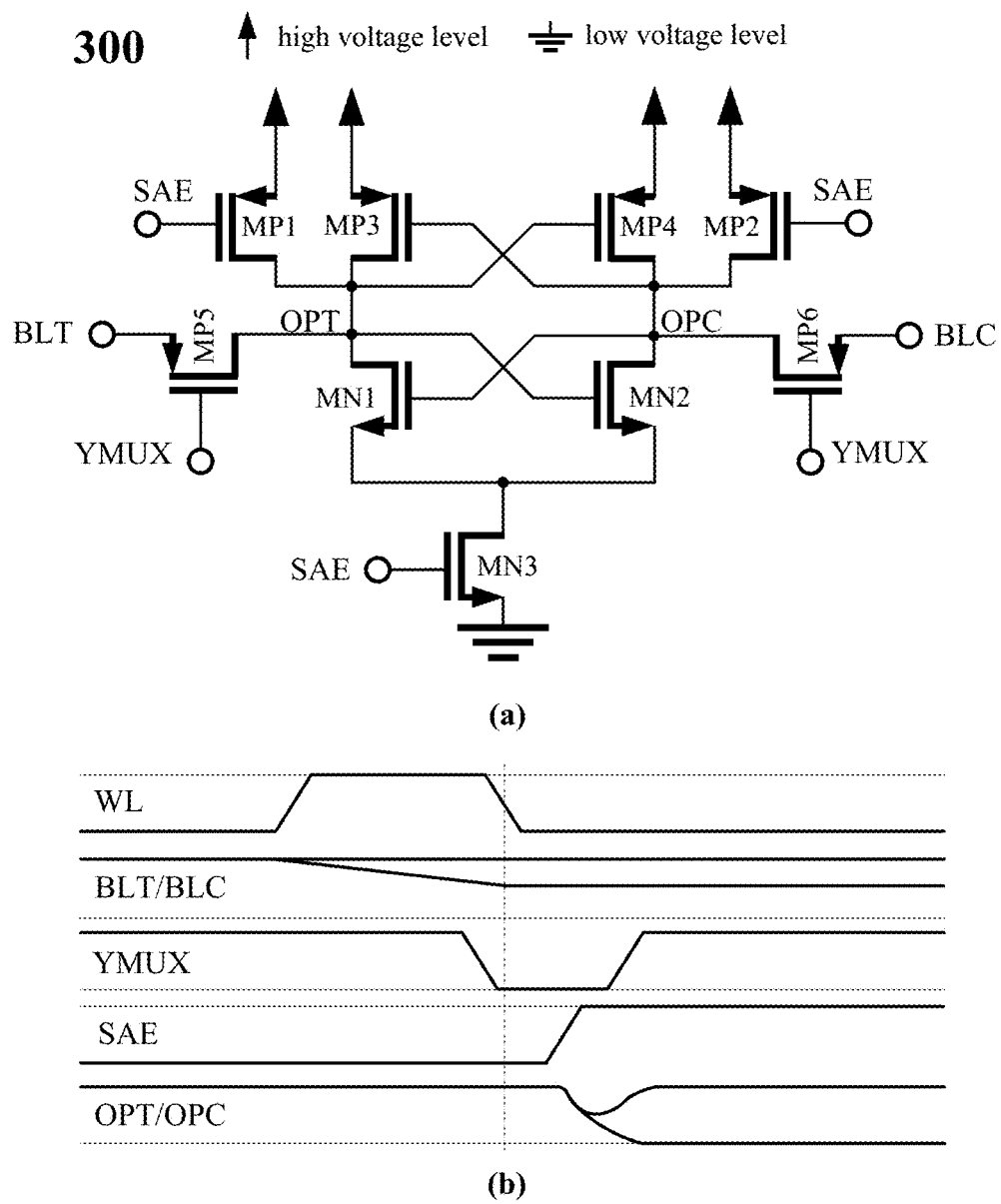
FIG. 3 shows a typical latch-type sense amplifier (prior art)
Figure 4:
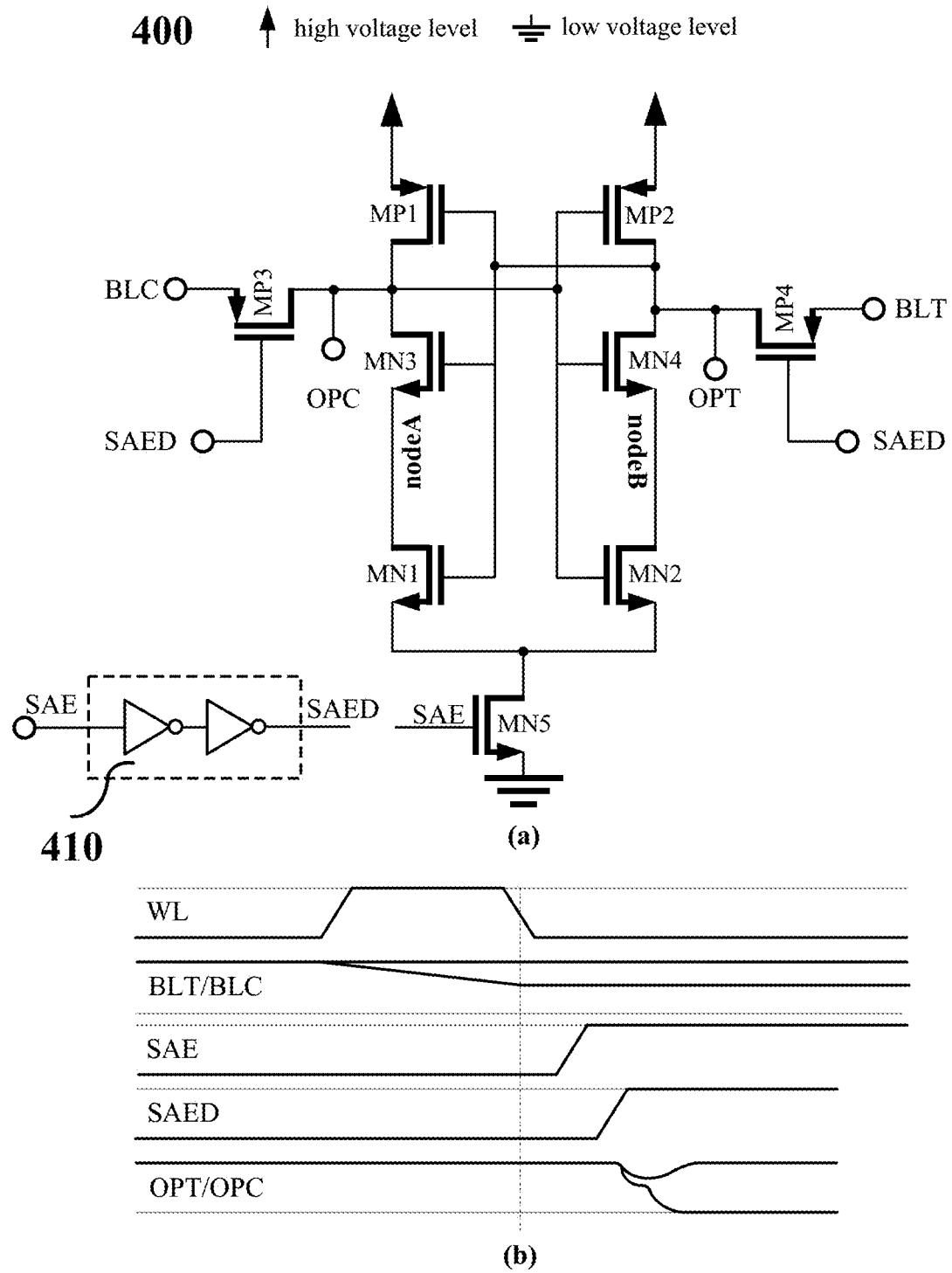
FIG. 4 shows a modified latch-type sense amplifier capable of threshold mismatch compensation (prior art)
Figure 5:
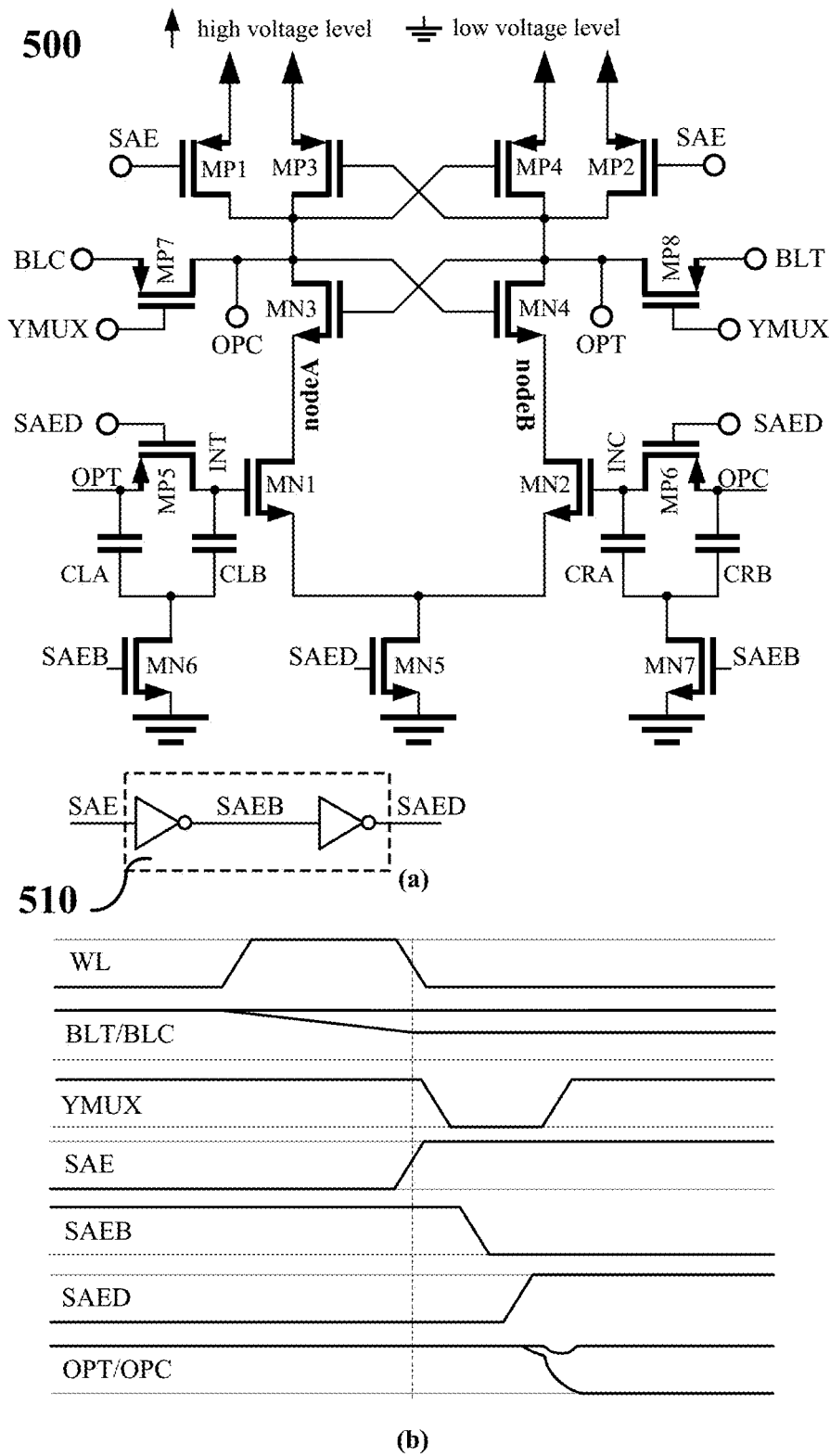
FIG. 5 shows an embodiment of the proposed sense amplifier circuit.

FIG. 5 shows an embodiment in accordance with the invention. The schematic in FIG. 5(*a*) has MN3, MN4, MP3, and MP4 as latching transistors formulating the latch with OPT and OPC as input-output nodes of the latch. Two PMOS transistors, MP1 and MP2, selectively couple nodes OPC and OPT to VDD when the sense enable signal (SAE) is low. Transistors MN3 and MN4 are the main sensing transistors of the latch because when the sensing operation starts transistors MP3 and MP4 are off and play a minor role in the operation. Gates of transistors MN1, and MN2 are also selectively coupled to nodes OPT and OPC respectively. These two transistors form a half latch and deemed as auxiliary sensing transistors. A two transistor, MP5 and MN6, and two capacitor, CLA and CLB, arrangement is connected between the gate of transistor MN1 and the OPT node. A similar arrangement is connected between the gate of transistor MN2 and the OPC node. Another set of two PMOS transistors, MP7 and MP8 selectively couple bitlines BLC, and BLT to node OPC and node OPT, respectively when YMUX signal is low. The transistor MN5 selectively couples the sense amplifier to the ground when signal SAED is high. A pair of inverters 510 provides complement as well as delayed version of SAE signal.

The aforementioned embodiment is capable of mitigating the threshold voltage mismatch between the main sensing transistors, MN3 and MN4, as taught by the U.S. Pat. No. 7,227,798 B2. In addition, the transistor-capacitor arrangement of MP5, MN6, and CLA, CLB; boosts the overdrive voltage of the transistor MN1. Similarly the transistors-capacitor arrangement of MP7, MN7, and CRA, CRB boosts the overdrive voltage of the transistor MN2. Consequently, the sense amplifier makes faster decision. More importantly, such an arrangement also amplifies the differential input swing seen at the gate of MN1 and MN2 which can be explained in next paragraph.

FIG. 5(*b*) illustrates the preferred timing arrangement of the control signals. The working of the sense amplifier can be described as follows: the bitlines, BLT and BLC are precharged to high level. During this time the latching nodes of the sense amplifier, OPT and OPC are also precharged to high level by low SAE signal. The 0→1 transition of wordline signal, WL, starts discharging of one the bitlines by the selected SRAM cell. While the signal is being developed on the bitlines, the SAE signal makes 0→1 transition allowing OPT and OPC to be in high impedance. Once a sufficient differential voltage is developed across the bitlines, the access control signal YMUX makes 1→0 transition coupling the bitlines to the latching nodes of the sense amplifier. Assuming without the loss of generality, the BLT is discharged to (VDD−ΔV) owing to the charge sharing with the data stored in the bit-cell, while BLC remains at VDD. During this period the SAED is low, therefore voltage at OPT=(VDD−ΔV), while voltage at OPC=VDD. The SAEB signal is still high owing to the delay chain; therefore, capacitances CLA and CLB are in parallel and store voltage (VDD−ΔV). Similarly, capacitances CRA and CRB are in parallel and store voltage VDD. Subsequently, SAEB makes a 1→0 transition, and soon afterwards the SAED makes 0→1 transition. As a result parallel, parallel capacitors arrangement is transformed into a serial arrangement. The signal across the CLA and CLB is now 2(VDD−ΔV) which is applied to the gate of MN1. Similarly, the signal across CRA and CRB is 2VDD which is applied to the gate of MN2. Under realistic situation, the gain of the signal is lower owing to various parasitic and timing considerations.

It is apparent to a person knowledgeable in art that the signal timing in the design and implementation of the sense amplifier is critical. The present embodiment is no different. The 510 represents a simple way to achieve delayed and complement signal. The number of inverters in the chain can be increased beyond two if the need arises.

Figure 6:
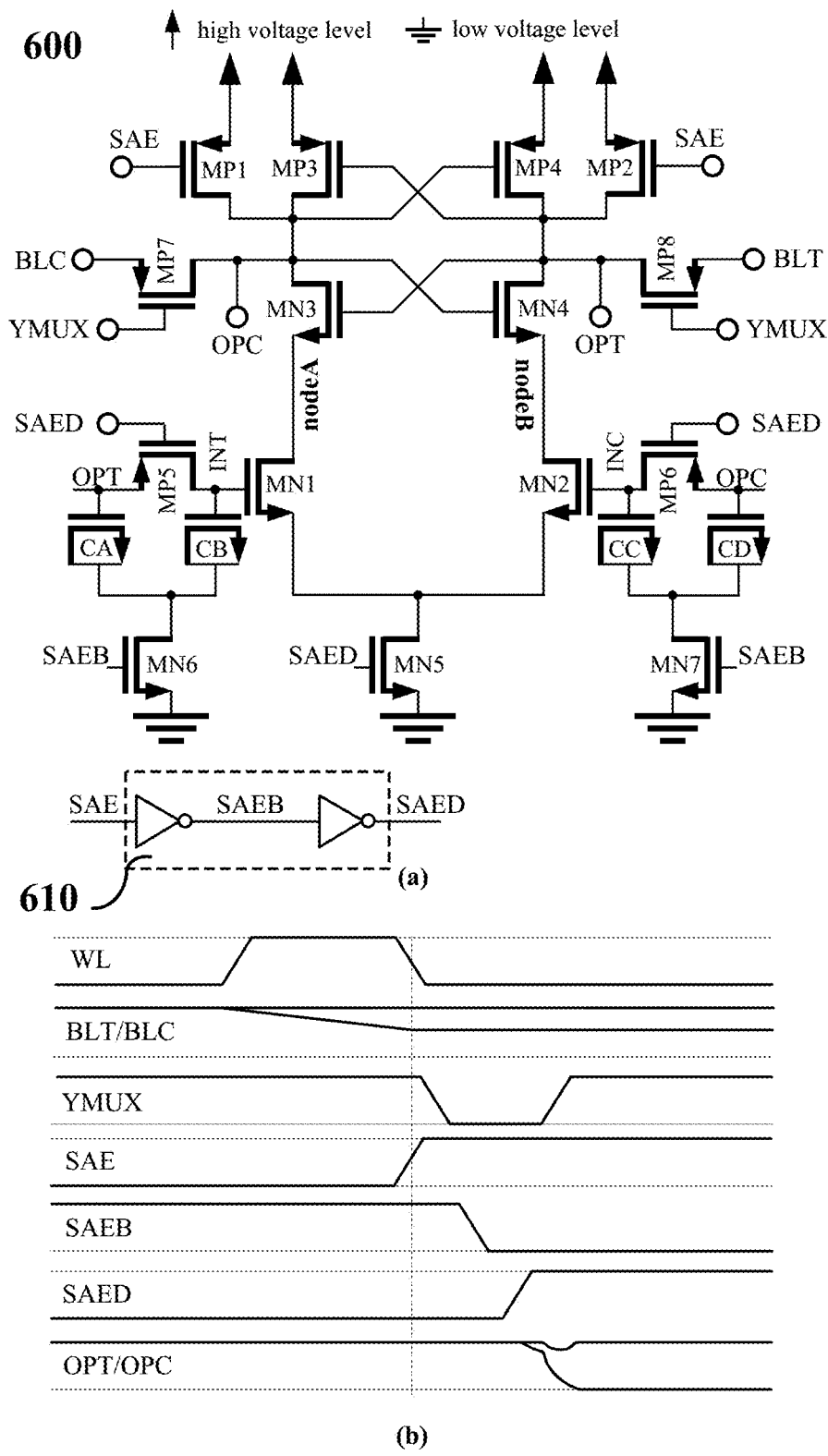
FIG. 6 shows another embodiment of the proposed sense amplifier circuit.

FIG. 6 depicts another embodiment of the sense amplifier and its associated timing in accordance with the invention. In this embodiment, capacitors, CA, CB, CC, CD are implemented with transistor capacitances.

Figure 7:
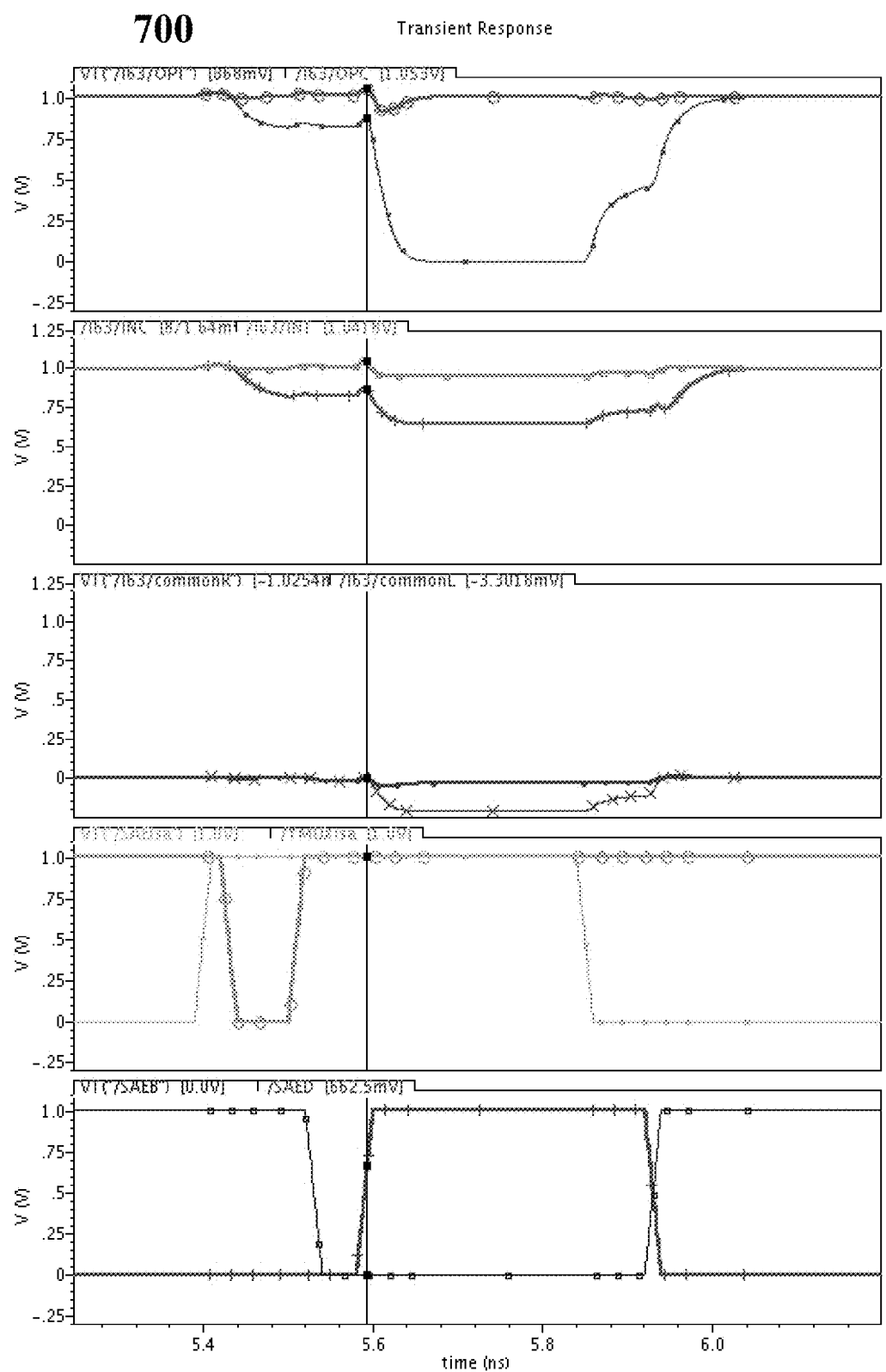
FIG. 7 shows simulation results of the sense amplifier illustrated in FIG. 6.

FIG. 7 illustrates the simulation results on the embodiments depicted in FIG. 6. Simulation results show when the sense amplifier is activated by making a 0→1 transition at SAED signal. At that instance, the differential inputs at nodes OPT and OPC; as well as at INT and INC node are boosted proportional to its input levels.

Figure 8:
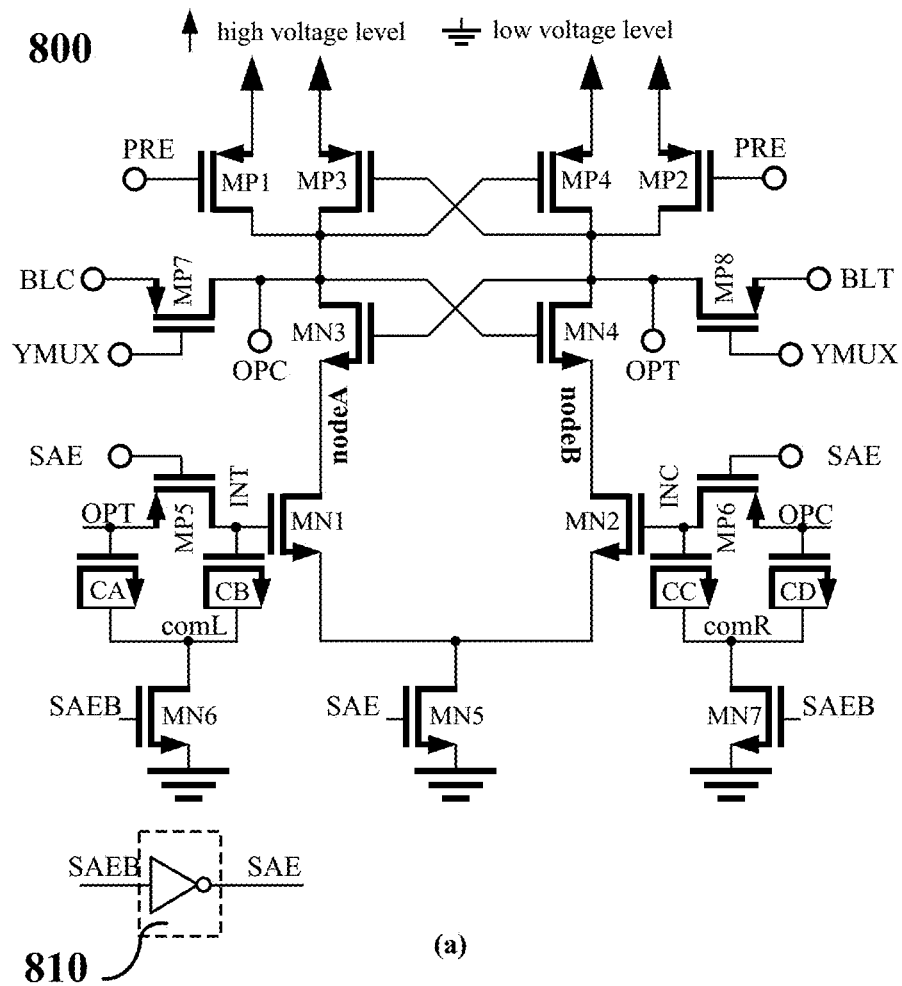
FIG. 8 shows another embodiment of the proposed sense amplifier circuit.
Figure 8:
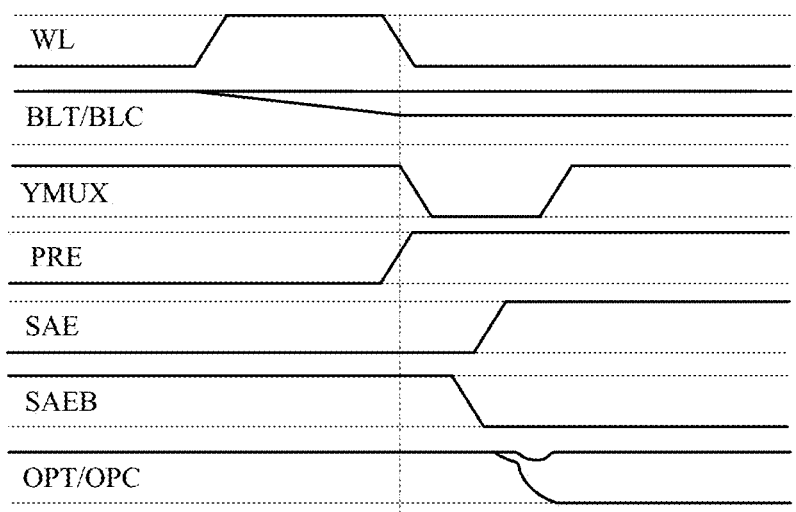

FIG. 8 shows another embodiment in accordance with the invention. The schematic in 8(*a*) and associated timing in 8(*b*) has three independent timing signal—Precharge signal (PRE), Access control signal (YMUX), and Sense amplifier enable signal (SAEB). It makes timing of the sense amplifier simpler and more reliable.

Figure 9:
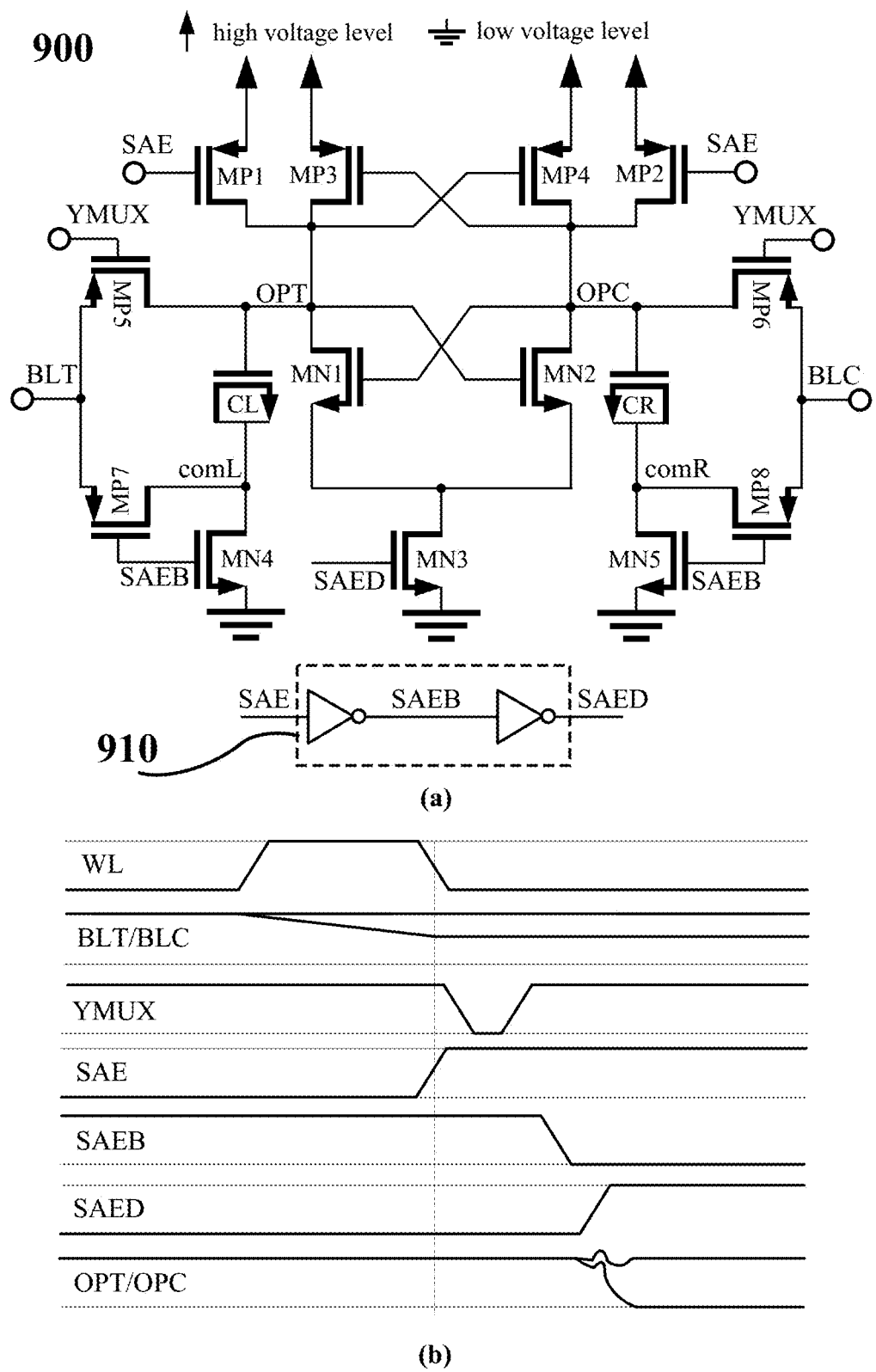
FIG. 9 shows another embodiment of the proposed sense amplifier circuit.

FIG. 9(*a*) shows another embodiment in accordance with the invention. In this embodiment, the aforementioned latch-type sense amplifier is modified to include two identical signal storage and amplification circuits. In this embodiment an alternative implementation of the signal storage and boosting circuit is illustrated. This particular embodiment of the signal storage and boosting circuit consists of two transistors, MP7 and MN4, and a capacitor, CL. The CL is implemented by a transistor. The second signal storage and boosting circuit consists of transistors MP8 and MN5, and capacitor CR which is implemented with a transistor. These storage and boosting circuits at one end are connected to the latching nodes, OPT and OPC of the sense amplifier, respectively. On the other end they are connected to the respective bitlines, BLT and BLC.

FIG. 9(*b*) illustrates the timing of the embodiment in FIG. 9(*a*). The working of the sense amplifier can be described as follows: the bitlines, BLT and BLC are precharged to high level. During this time the latching nodes of the sense amplifier, OPT and OPC are also precharged to high level by low SAE signal. The 0→1 transition of the wordline signal, WL, starts discharging one of the bitlines by the selected SRAM cell. While the signal is being developed on the bitlines, the SAE signal makes 0→1 transition allowing OPT and OPC to be in high impedance. Once a sufficient differential voltage is developed across the bitlines, the access control signal YMUX makes 1→0 transition coupling the bitlines to the latching nodes of the sense amplifier. Assuming without the loss of generality, the BLT is discharged to (VDD−ΔV) owing to the charge sharing with the data stored in the bit-cell, while BLC remains at VDD. During this period the SAED is low, and latch is not powered. Therefore, the voltage at OPT=(VDD−ΔV), while voltage at OPC=VDD. The SAEB signal is still high owing to the delay chain; therefore, capacitance CL stores voltage (VDD−ΔV). Similarly, capacitance CR stores voltage VDD. Now, YMUX makes 0→1 transition switching transistors, MP5 and MP6 off. Subsequently, SAEB makes a 1→0 transition, and soon afterwards the SAED makes 0→1 transition. As a result, MP7 and MP8 are turned on while MN4 and MN5 are turned off. The signal at the bottom of capacitor CL is raised from 0 V to (VDD−ΔV) and consequently, the node OPT is raised to 2(VDD−ΔV). With a similar argument, it can be shown that the node OPC is raised to 2VDD. Therefore, at the start of the sensing operation, the differential signal between OPT and OPC nodes is increased to 2ΔV. Once again, it should be highlighted that under realistic conditions, the gain of the signal is lower owing to various parasitic and timing considerations.

Figure 10:
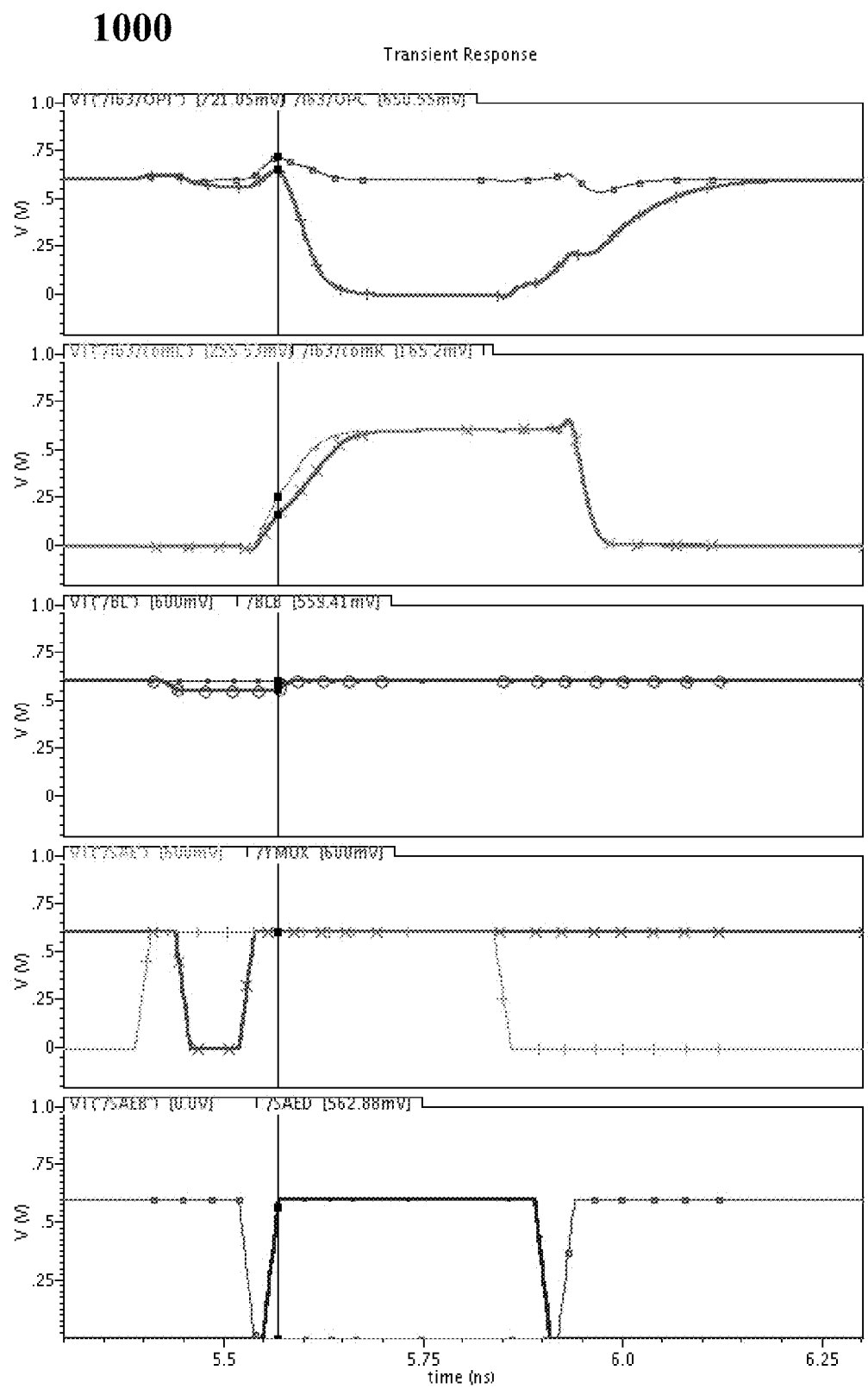
FIG. 10 shows simulation results of the sense amplifier illustrated in FIG. 9.

FIG. 10 illustrates the simulation results carried out at 0.6 V VDD with differential input at 40 mV. It can be seen from the simulation results as SAED makes 0→1 transition, the nodes OPT and OPC get boosted voltage proportional to the input signal.

Figure 11:
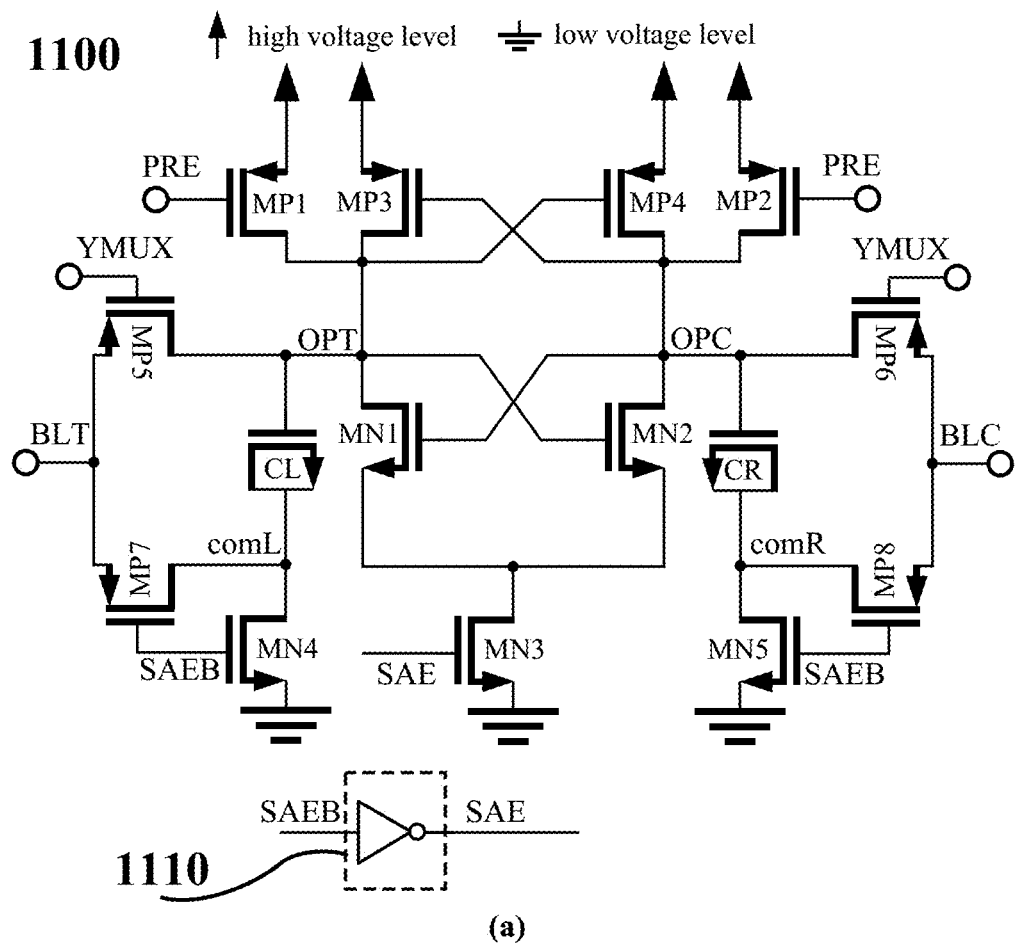
FIG. 11 shows another embodiment of the proposed sense amplifier circuit.
Figure 11:
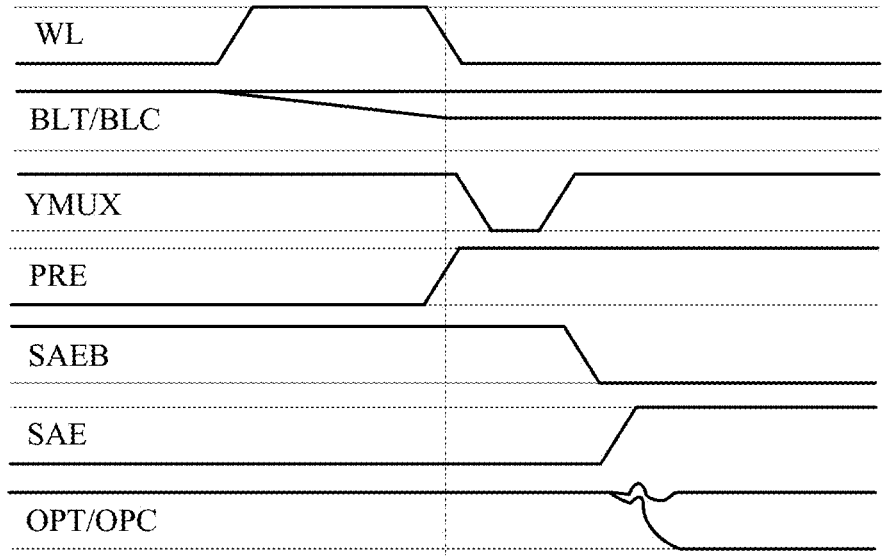

FIG. 11 shows another embodiment in accordance with the invention. The schematic in 11(a) and associated timing in 11(b) has three independent timing signal—Precharge signal (PRE), Access control signal (YMUX), and Sense amplifier enable signal (SAEB). It makes timing of the sense amplifier simpler and more reliable.

Although the disclosed method has been described in connection with the embodiments illustrated in the accompanying drawings, it is not limited thereto. It will be apparent to those skilled in art that various substitutions, modification and changes may be made thereto without departing from the scope of the disclosure.

What is claimed is:

1. A sense amplifier circuit configuration enabling reliable operation, comprising:
    a latch comprising first and second latch node, first and second sensing transistor, first and second load transistor, first and second precharge transistor, first and second column multiplexer transistor, first and second auxiliary sensing transistor serially connected to the first and second sensing transistor, first and second internal node, first and second bitline, an activation transistor; and
    first and second bitline signal amplification and boosting means; and
    coupling means to selectively couple said first and second latch nodes to said first and second bitlines via said first and second column multiplexer transistor; and
    one precharge signal to selectively couple the first and second latch nodes to supply voltage via said first and second precharge transistors; and
    one activation signal; and a signal delay and signal complementing means to delay and complement said activation signal.

2. A sense amplifier of claim 1, where the first signal amplification and boosting means is coupled to the gate of first sensing transistor and the gate of first auxiliary sensing transistor; and the second signal amplification and boosting means is coupled to the gate of second sensing transistor and the gate of second auxiliary sensing transistor.

3. A signal amplification and boosting means of claim 1 comprising of two capacitors, and a PMOS transistor, and an NMOS transistor; and is capable of selectively arranged be in parallel holding bitline voltage; and is capable of selectively arranged capacitors in series by said activation signal or its derivative.

4. A bitline signal amplification and boosting means of claim 1 is capable of voltage boosting proportional to the voltage at a said bitline.

5. A signal amplification and boosting circuit of claim 1 where capacitors are implemented with a capacitance associated with a transistor.

6. A sense amplifier of claim 1 where delayed activation signal selectively activates the said activation transistor.

7. A sense amplifier of claim 1 where the said activation signal is logically derived from the said precharge signal.

8. A sense amplifier circuit configuration enabling low-voltage, reliable operation, comprising:
    a latch comprising first and second latch node, first and second sensing transistor, first and second load transistor, first and second precharge transistor, first and second column multiplexer transistor, first and second bitline, an activation transistor; and
    first and second bitline signal storage nodes and boosting means; and
    coupling means to selectively couple said first and second bitline signal storage nodes to said first and second latch nodes; and
    coupling means to selectively couple said first and second latch nodes to said first and second bitlines via said first and second column multiplexer transistor; and
    one precharge signal to selectively couple the first and second latch nodes to supply voltage via said first and second precharge transistors; and
    one activation signal; and a signal delay and signal complementing means to delay and complement said activation signal.

9. A sense amplifier of claim 8, where the first bitline signal storage and boosting means is selectively coupled to the first bitline and to the first latch node; and the second signal amplification and boosting means is selectively coupled to the second bitline and to the second latching node.

10. A bitline signal storage and boosting means of claim 8 comprising of a capacitor, and a PMOS transistor, and an NMOS transistor.

11. A bitline signal storage and boosting means of claim 8 is capable of voltage boosting proportional to the voltage at a said bitline.

12. A signal storage and boosting circuit of claim 8 where capacitors are implemented with a capacitance associated with a transistor.

13. A sense amplifier of claim 8 where delayed activation signal selectively activates the said activation transistor.

14. A sense amplifier of claim 8 where the said activation signal is logically derived from the said precharge signal.

* * * * *